United States Patent [19]
Zondler

[11] Patent Number: 4,726,965
[45] Date of Patent: Feb. 23, 1988

[54] METALLIZING TRANSPARENT CONDUCTIVE PATHS

[75] Inventor: Rolf Zondler, Stuttgart, Fed. Rep. of Germany

[73] Assignee: Standard Elektrik Lorenz AG, Stuttgart, Fed. Rep. of Germany

[21] Appl. No.: 919,158

[22] Filed: Oct. 15, 1986

[30] Foreign Application Priority Data

Oct. 16, 1985 [DE] Fed. Rep. of Germany ....... 3536821

[51] Int. Cl.$^4$ .............................................. C23C 18/28
[52] U.S. Cl. ..................................... 427/98; 427/108; 427/304; 427/305
[58] Field of Search .................. 427/98, 108, 304, 305

[56] References Cited

U.S. PATENT DOCUMENTS

| | | | |
|---|---|---|---|
| 4,002,778 | 1/1977 | Belles | 427/305 |
| 4,075,416 | 2/1978 | Kuttner et al. | 174/68.5 |
| 4,387,116 | 6/1983 | Bucker | 427/75 |
| 4,478,690 | 10/1984 | Scholtens | 427/108 |
| 4,666,078 | 5/1987 | Ohno | 228/124 |

FOREIGN PATENT DOCUMENTS

| | | |
|---|---|---|
| 0132784 | 2/1985 | European Pat. Off. . |
| 2302194 | 8/1976 | Fed. Rep. of Germany . |
| 2807350 | 1/1983 | Fed. Rep. of Germany . |

Primary Examiner—John D. Smith
Attorney, Agent, or Firm—Christie, Parker & Hale

[57] ABSTRACT

To metallize transparent conductive paths of indium tin oxide (ITO) on substrates of display devices, a solderable metal layer is applied by electroless deposition. If the metal layer is adjacent a liquid crystal display device, the display device may be manufactured and tested prior to the electroless deposition, with only an edge of the substrate being dipped into the deposition bath. Prior to the deposition of the solderable metal layer, the indium tin oxide surface may be reduced and an adhesion improving layer of may also be deposited by above the indium tin surface and below the solderable metal layer. Integrated circuits can then be soldered to the metallized conductive paths.

9 Claims, 2 Drawing Figures

METALLIZING TRANSPARENT CONDUCTIVE PATHS

BACKGROUND OF THE INVENTION

1. Field of the invention

The invention relates to a method for metallizing transparent conductive paths of indium tin oxide (ITO) such as may be found in dispaly devices.

2. Description of the prior art

German Pat. No. 28 07 350 discloses a liquid-crystal display device which has a glass substrate as a support for the display device and for an integrated circuit (IC chip). The substrate supports transparent conductive paths of indium oxide. The metallization of these conductive paths in the invisible part of the display device is effected by depositing two chromium-containing intermediate layers prior to the application of a gold layer. Five layers of chromium, copper, gold, copper and lead tin, respectively, are provided on the IC chip as a bonding layer. The metallization of the conductive paths, i.e. the deposition of the layers, is effected by an evaporation or sputtering process. These methods involve a great amount of energy and are technically complex.

SUMMARY OF THE PRESENT INVENTION

It is the object of the present invention to provide a simpler method for metallizing transparent conductive paths of indium tin oxide on substrates of the kind mentioned above.

In accordance with the present invention, this object is achieved by the electroless deposition of a solderable metal layer on the conductive paths. If the metal layer is adjacent a liquid crystal display device, the display device may be manufactured and tested prior to the electroless deposition, with only an edge of the substrate being dipped into the deposition bath. If required, prior to the deposition of the solderable metal layer, the indium tin oxide surface may be reduced and an adhesion improving layer of may also be deposited by above the indium tin surface and below the solderable metal layer.

The invention will now be described with the help of the accompanying drawings.

IN THE DRAWINGS

DETAILED DESCRIPTION OF THE PREFERRED EMBODIMENT

Figure 1:
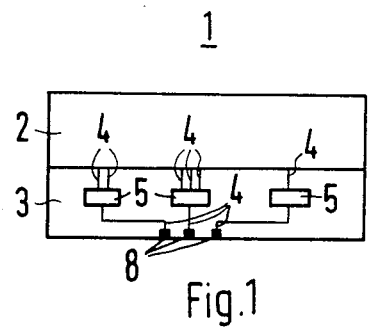
FIG. 1 is a top plan view of a display device.

The display device 1 shown in FIG. 1 from above has a main display portion and a edge portion which will be invisible in the later built-up condition of the display device. The main display portion of display device 1 has, i.e., a liquid-crystal display (not shown) which is supported on a display substrate 2 such as glass. This is also the material of edge substrate portion 3, where it supports conductive paths 4 leading to components 5, such as integrated circuits, and to connections 8 of the display device 1. The connections of the components 5 are connected to the conductive paths 4 by solder or by a conductive adhesive. It is important for this connection of the components 5 with the conductive paths 4 that the conductive paths have a suitable metal layer.

The electrodes present in the display substrate portion 2 of the display device 1 have a transparent, conductive layer of indium tin oxide (ITO). The conductive paths 4 in the portion 3 are initially made of the same material, since the electrodes in the display portion 2 and the conductive paths 4 in the portion 3 can then be produced simultaneously. However, since conductive paths of indium tin oxide do not have a solderable surface, they must subsequently be metallized.

The display portion 2 of the display device 1 is manufactured and checked. In this condition, the manufactured and tested display devices do not yet have components 5 attached in the edge substrate portion 3. In order for the conductive paths 4 to be metallized, the display device is mounted in a working station in which a solderable metal layer is applied to the conductive paths 4 by electroless deposition. The metal layer can be a gold, silver, nickel, copper or tin layer. The metal layer is deposited by immersion of the substrate edge portion 3 of the previously manufactured and tested display device in a bath containing the corresponding metal salt with the addition of stabilizers, and other additives such as complexing, reducing and buffering agents. The following are typical bath compositions for the deposition of gold:

| | | |
|---|---|---|
| 0.6 g/l of AuCl₃ | or | 1 g/l of AnCl₃ |
| 1 g/l of Na₂HPO₄ | | 30 g/l of trisodium citrate |
| 1 g/l of NaOH | | 11 ml of HCL 37% |
| 3 g/l of Na₂SO₄ | | |
| 10 g/l KCN. | | |

Figure 2:
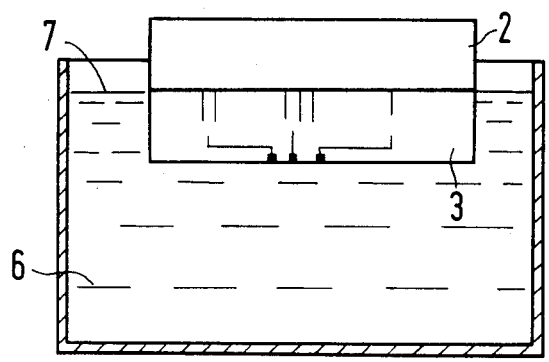
FIG. 2 shows the partial immersion of the display device in a bath.

FIG. 2 schematically shows the immersion of the display device 1 in a bath 6. The display device is immersed only until the bath surface 7 coincides with the separating line between the display portion 2 and the portion 3. Preferably, the gold layer deposited on the conductive paths 4 has a thickneses of between 50 and 1000 nm. Should it be necessary for better adhesion, the indium tin oxide can be reduced to indium tin prior to the metallization of the conductive layers. This reduction of the surface of the indium tin oxide can be carried out in a bath containing sodium hydrogenphosphite or sodium borohydride or aminoborane or formaldehyde or hydrazine.

Should the adhesion of the gold deposited on the conductive paths 4 not be sufficient, an adhesion improving layer can be applied to the conductive paths. For that purpose, nickel, chromium or copper is applied to the conductive paths 4 by electroless deposition. This deposition can also be carried out by immersion in a bath which, if nickel is to be deposited, has the following composition:

| | Baths containing phosphorus | Baths containing boron |
|---|---|---|
| Ni ions: | NiCl₂ | NiCl₂ |
| | NiSO₄ | NiSO₄ |
| Reducing agents: | NaH₂PO₂ (na hypophosphite) | sodium borohydride |
| | | N—diethyl aminoborane |
| | | N—dimethyl aminoborane |
| organic complexing agents | hydroxyacetic acid | ethylenediamene |
| | hydroxypropionic acid | sodium citrate |
| | citric acid | sodium succiate |
| | malonic acid | solium acetate |
| accelerators: | anions of succinic or adipic acid | |
| | alkali fluorides | |
| stabilizers: | thiourea | thallium sulphate |
| | lead sulphide | |

| Baths containing phosphorus | | Baths containing boron |
|---|---|---|
| | tin sulphide | |
| buffering agents: | like complexing agents | like complexing agents |
| ph regulators: | $H_2SO_4$ | NaOH |
| | HCl | |
| | $Na_2CO_3$ | |
| | NaOH | |
| | $NH_4OH$ | |
| wetting agents: | alcohol sulphates | |
| | fatty acid sulphonates | |
| | alkylarenesulphonates | |

The following is a typical bath composition for the deposition of nickel:

| 30 g/l of | $NiCL_2 \times 6\ H_2O$ |
|---|---|
| 10 g/l of | $NaH_2PO_2$ |
| 100 g/l of | sodium citrate |
| 50 g/l of | $NH_4Cl$ |
| ph | 8-10. |

This may then be followed by the gold metallization described above.

After metallization of the substrate edge portion 3 as described above, the components 5 are mounted on the portion 3 and their connections are connected to the conductive paths 4 by solder or adhesive, so as to give a display device which forms a unit together with the components.

What is claimed is:

1. A method for metallizing transparent conductive paths of indium tin oxide on of a substrate comprising the steps of
   (a) first reducing the surface of said conductive paths to indium tin in a first bath containing a reducing agent and
   (b) thereafter applying an outer layer of a first metal over the said conductive paths by electroless deposition using a second bath containing a salt of said first metal.

2. A method as claimed in claim 1, wherein said first metal is selected from the group consisting of gold, silver, nickel, copper and tin.

3. A method as claimed in claim 2 wherein said substrate includes a second portion bearing a manufactured and tested display device, said method further comprising the step of
   (c) immersing only an edge portion of said substrate in said second bath.

4. A method as claimed in claim 3, wherein said first metal is gold and said layer layer has a thickness of between 50 nm and 1000 nm.

5. A method as claimed in claim 1, further comprising prior to said depositing step (a), the additional step
   (d) applying an adhesion improving layer of a second metal selected from the group consisting of nickel, chromium and copper directly over the conductive paths (4) by electroless deposition.

6. A method as claimed in claim 1, further comprising prior to said depositing step (a) and subsequent to said reducing step (c), the additional step (e) applying an adhesion improving layer of a second metal selected from the group consisting of nickel, chromium and copper directly on said reduced indium tin surface by electroless deposition.

7. A method as claimed in claim 1 wherein said reducing agent contained in said first bath is selected from the group consisting of sodium hydrogenphosphite, sodium borohydride, aminoborane, formaldehyde, and hydrazine.

8. A method as claimed in claim 1 wherein said second bath further contains an additive selected from the group consisting of stabilizers, complexing agents, reducing agents, and buffering agents.

9. A method as claimed in claim 8 wherein said second bath contains phosphorus and said additive is a reducing agent selected from the group consisting of sodium hypophosphite, sodium borohydride, N-diethyl aminoborane, and N-dimethyl aminoborane.

* * * * *